United States Patent [19]
Papp et al.

[11] 4,232,264
[45] Nov. 4, 1980

[54] ARRANGEMENT FOR THE MAGNETO-OPTICAL MEASUREMENT OF CURRENTS

[75] Inventors: Alfred Papp; Hauke Harms, both of Munich, Fed. Rep. of Germany

[73] Assignee: Siemens Aktiengesellschaft, Munich, Fed. Rep. of Germany

[21] Appl. No.: 970,351

[22] Filed: Dec. 18, 1978

[30] Foreign Application Priority Data

Dec. 29, 1977 [DE] Fed. Rep. of Germany ....... 2758611

[51] Int. Cl.² .................... G01R 31/02; G01R 33/02
[52] U.S. Cl. ................................. 324/96; 324/117 R; 324/244
[58] Field of Search .................. 324/96, 117 R, 127, 324/244; 350/150

[56] References Cited

U.S. PATENT DOCUMENTS 3,708,747  1/1973  Lesueur .............................. 324/96

FOREIGN PATENT DOCUMENTS 2130047  11/1974  Fed. Rep. of Germany .

OTHER PUBLICATIONS

Rogers, A. J., "Optical Methods . . . ", A.I.M., Liege, Traitment des Donnes, 1977, pp. 6-1 to 6-12.

*Primary Examiner*—Ernest F. Karlsen
*Attorney, Agent, or Firm*—Kenyon & Kenyon

[57] ABSTRACT

An arrangement for the magneto-optical measurement of currents with a linearly polarized light beam in which the measuring path contains an analyzer with two orthogonal pass directions, over which the partial beams are conducted, has a light deflector which directs one partial beam alternatingly at a high frequency to a detector which is arranged in the other partial beam so that the detector receives alternatingly the measurement signal with the noise component and the noise component only.

4 Claims, 3 Drawing Figures

ARRANGEMENT FOR THE MAGNETO-OPTICAL MEASUREMENT OF CURRENTS

BACKGROUND OF THE INVENTION

This invention relates to the magneto-optical measurement of currents in general and more particularly to an arrangement for the magneto-optical measurement of currents utilizing a rotation of the plane of polarization, dependent on the current to be measured, of a linearly polarized light beam, which is split into partial beams with orthogonal directions of polarization.

Measuring devices for currents in high voltage conductors and for large AC currents with a DC component wherein a light beam is fed via a polarizer and a magneto-optical measuring sensor, as well as through an analyzer, to a detector which is followed by an electronic circuit are known. The plane of polarization of the light beam is subjected to a rotation corresponding to the magnitude of the current in the measuring sensor, which is influenced by the magnetic field of the current to be measured. In an evaluator arranged at low-voltage potential, the magnitude of the rotation is converted, in an analyzer, into a corresponding intensity signal which can be picked up by a photo detector. The output signal of the detector is fed to the electronic circuit.

In one known arrangement, the evaluator contains an analyzer in which the light coming from the measuring sensor is split into two partial light beams, the planes of polarization of which are orthogonal and which change their intensity in opposite directions with the angle of rotation of the plane of polarization of the incident beam. The two partial light beams are fed to separate detectors which can preferably be semiconductor photo diodes and the outputs of which are fed to a differential amplifier. The difference voltage at the amplifier input is a measure for the Faraday rotation of the measurement signal. With this method, the noise components of the measurement signal, which are caused by intensity variations of the light beam, preferably a laser beam, can be eliminated. However, the photo diodes used have a small spread in their sensitivity. In addition, it is unavoidable, in a technical realization of the design, that the laser beams on the semiconductor photo cathode vary locally. These diodes have a production related location dependence of their photo sensitivity. Beam displacements of a few $\mu m$ can cause signal variations of up to several percent. The detectors associated with the two partial beams therefore furnish different signal variations which cannot be eliminated by the known differential measuring method (German Pat. No. 2,130,047).

Another known method (Rogers in "Optical Methods for Measurement of Voltage and Current at High Voltage", A.I.M., Leige, Traitment des donnes—1977, page 6, para. 3.2(c), Intensity Distribution Noise) therefore, works with a modulated light beam which is fed, via the measuring sensor and an analyzer, to a single photo diode, the output signal of which is processed in an electronic circuit.

The detector measures the intensity of the arriving measurement signal which also contains the superimposed modulation signal. Demodulation takes place in the following electronic circuitry. The intensity is influenced by the Faraday rotation in the measuring sensor as well as by the noise components, namely, the intensity fluctuations of the radiation source, as well as intensity variations which are caused by mechanical vibrations of the optical components in the ray path, and in addition, by the sensitivity of the photo diode itself. With this measuring method, the two intensity components can be separated from each other and the noise component on the measurement signal is suppressed. However, the linearity between the useful signal and the measurement signal is sufficient only at small angles of rotation up to about 2°. For larger angles of rotation, with a correspondingly larger signal to noise ratio, a nonlinearity is obtained which depends on the signal amplitude.

SUMMARY OF THE INVENTION

It is now an object of the present invention to provide a measuring arrangement for very accurate measurements with a measuring error of, for instance, less than 0.2%, which permits a substantially larger rotation of the plane of polarization.

According to the present invention, this problem is solved with a two beam arrangement of the type mentioned at the outset by providing a light deflector in one partial light beam which directs that partial light beam alternatingly, at a high frequency, to a detector which is arranged in the other partial light beam. The direction of polarization of the measurement signal is switched back and forth between the two orthogonal directions of polarization at the switching frequency which is at least one order of magnitude and, preferably, at least two orders of magnitude higher than the signal frequency. The detector therefore receives alternatingly the intensity of the measurement signal in one state of polarization and subsequently the sum of the intensities of both partial light beams with the two states of polarization.

DETAILED DESCRIPTION OF THE INVENTION

Figure 1:
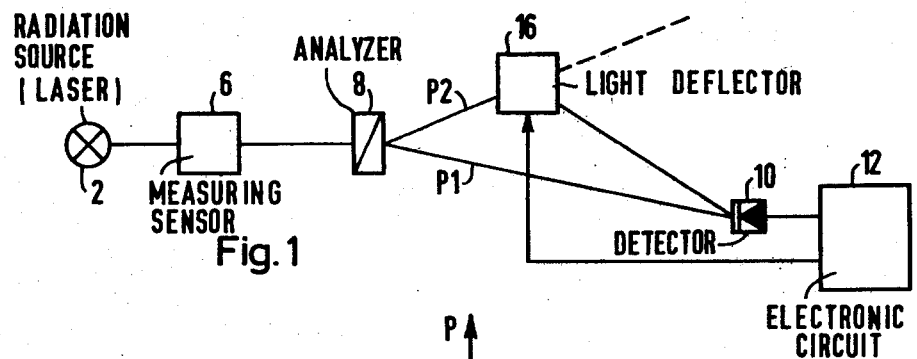
FIG. 1 is a block diagram of an embodiment of a measuring arrangement according to the present invention.

In FIG. 1 there is shown a radiation source 2, a measuring sensor 6, an analyzer 8 and a detector 10. The detector 10 is followed by an electronic circuit 12. The arrangement also includes a light deflector 16. The radiation source 2, e.g., a laser, furnishes a beam, not specifically designated, of linearly polarized light, preferably a laser beam, the direction of polarization of which is rotated in the measuring sensor 6 as a function of the magnitude of a magnetic field which surrounds an electric conductor, not shown in the figure, preferably a high voltage conductor, the current of which is to be measured. Measuring sensor 6 can comprise a light guide fiber (e.g., a monomode fiber) which is looped around the current carrying conductor and is provided with a feed from the light source and a return to the analyzer. The analyzer 8 acts as a polarization beam divider and can preferably consist of the type of analyzer prism which is known as a Wollaston prism. Such analyzers contain mutli-part prisms of calcite or quartz. A Foster polarization beam divider can also be used. In the analyzer 8, two separate partial light beams P1 and P2 are formed, the directions of polarization of which are orthogonal, i.e., include an angle of 90°. The partial beam P2 strikes the light deflector 16 and is either passed by the latter alternatingly at a high switching frequency $f_m$, as is indicated in the figure by the dashed line, or it is directed toward the detector 10. Light deflector 16 can take any of a number of forms. For example, there are mechanical light deflectors which work with a rotating mirror, as well as acousto-optical light deflectors and also piezoelectric light deflectors. Mechanical light deflectors are relatively slow (kHz range). On the other hand, acousto-optical light deflectors can be used up into the MHz range. The detector therefore receives alternatingly, at the switching frequency of, say 50 kHz, which is far higher than the signal frequency of, for instance, 50 Hz, the partial light beam P1 with the one direction of polarization and subsequently, the sum of the two partial light beams P1 and P2.

Figure 2:
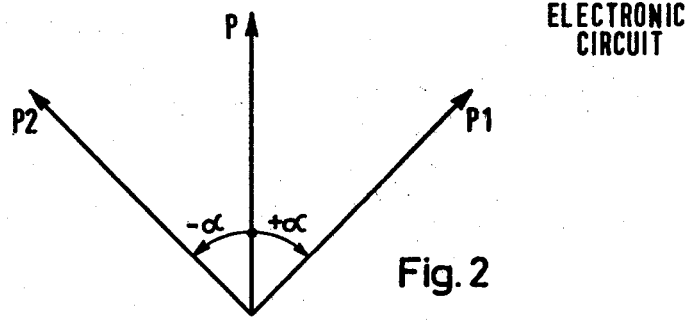
FIG. 2 shows the correlation of the partial light beams.

With a direction of polarization P of the linearly polarized light beam, the orthogonal directions of polarization of the two partial light beams P1 and P2 always include, according to FIG. 2, a positive and a negative angle $\alpha$, respectively, of 45°. For the partial light beam P1, which is fed to the detector 10 directly, the detector signal is then, for $\alpha = +45°$:

$$D_- = (\tfrac{1}{2}) p(t) \cdot I(t) (1 - \sin 2F(t))$$

where $p(t)$ is the sensitivity of the detector, $I(t)$ the intensity of the light beam and $F(t)$ the measured Faraday rotation signal.

This signal is received by the detector 10 as long as the light deflector 16 passes its partial light beam P2. As soon as the light deflector 16 directs its partial light beam toward the detector 10, the latter also receives the additional detector signal.

$$D_+ = (\tfrac{1}{2}) p(t) \cdot I(t) (+\sin 2F(t))$$

The detector signal therefore consists, during this time, of the sum of the individual signals and one obtains $$D_+ + D_- = P(t) \cdot I(t)$$

which corresponds to the pure noise component of the measurement signal. The detector 10 therefore delivers, in the rhythm of the switching frequency $f_m$, alternatingly, the total measurement signal with the rotation component and the noise component and, subsequently, only the noise component.

In a similar manner, the partial light beam P2 can be directed toward the detector 10 directly and the other partial light beam P1 fed additionally to the detector 10 in the rhythm of the switching frequency $f_m$.

Figure 3:
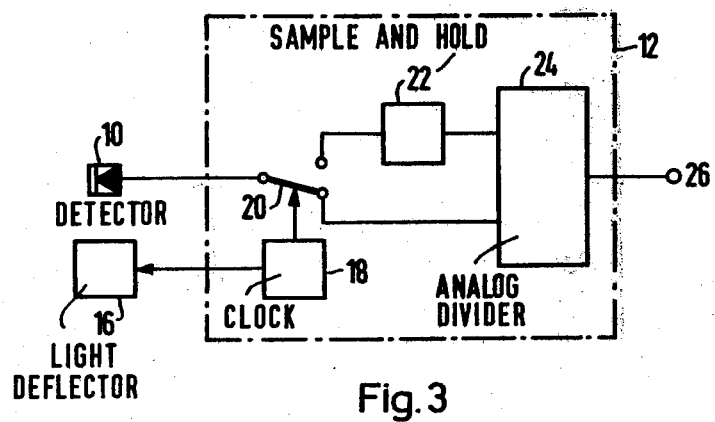
FIG. 3 is a block diagram of an embodiment of an electronic circuit for use in the present invention.

In the electronic circuit 12 according to FIG. 3, the output signal of the detector 10 is alternately fed, via an electronic switch 20, to an electronic memory 22, e.g., a sample and hold circuit and an electronic computer 24 in the rhythm of the switching frequency $f_m$ predetermined by a clock 18. The output of clock 18 also drives the light deflector 16 so that switch 20 and light deflector 16 are synchronized. The memory 22, which operates, for instance, as a sample and hold circuit, samples the detector signal $D_-$, stores it and passes it on to one input of the computer 24 during the following time interval, after the switch 20 has switched over to the position shown on the drawing. During this time, the sum signal $D_+ + D_-$ is fed directly to the other input computer 24.

The computer forms the quotient of the detector signal $D_-$ and the detector signal $D_{30} + D_-$, representing the sum of the partial light beams P1 and P2, and one obtains, at the output 26, the signal:

$$U_{26} = D_-/(D_{30} + D_-) = (\tfrac{1}{2})(1 - \sin 2F(t)).$$

The computer module 24 can, in principle, be implemented with an operational amplifier. However, a two-quadrant analog divider is preferred.

The constant factor 1 can be eliminated, for instance, by electronic filtering, and the sine can be linearized in a manner known per se with an electrical arcsin module.

What is claimed is:

1. An arrangement for the magneto-optical measurement of currents, utilizing a rotation of the plane of polarization of a linearly polarized light beam which is dependent on the current to be measured comprising:
   (a) a radiation source developing a linearly polarized light beam;
   (b) a measuring sensor adapted to be disposed at a conductor carrying the current to be measured, having said beam as an input and providing an output beam whose plane of polarization has been rotated in dependence on the current being measured;
   (c) an analyzer interposed in said output beam for splitting said beam into two partial beams having orthogonal directions of polarization;
   (d) a detector arranged so that one of said partial beams is incident thereon;
   (e) a light deflector interposed in the other of said partial beams and adapted to alternatingly, at a high frequency, pass said other partial beam and direct said other partial beam to be incident on said detector; and
   (f) electronic circuit means receiving at the high frequency of said light deflector first and second output signals from said detector dependent respectively on said one partial beam and said both partial beams for combining said signals to eliminate the noise component of the measurement signal.

2. The arrangement according to claim 1, wherein said analyzer comprises a Wollaston prism.

3. The arrangement according to claim 1 wherein said electronic circuit means comprise:
   (a) means to store one of said first and second signals from said detector;
   (b) means to find the quotient of two signals and to provide an output proportional thereto; and
   (c) means to couple to said means to find the quotient, the signal stored in said means to store and the other of said first and second signals from said detector.

4. A method of operating an arrangement for the magneto-optical measurement of currents, utilizing a rotation of the plane of polarization of a linearly polarized light beam which is dependent on the current to be measured which arrangement includes a radiation source developing a linearly polarized light beam, a measuring sensor adapted to be disposed at a conductor carrying the current to be measured, having said beam as an input and providing an output beam whose plane of polarization has been rotated in dependence on the current being measured, and an analyzer interposed in said output beam for splitting said beam into two partial beams having orthogonal directions of polarization, comprising:
- (a) alternatingly directing to a detector, at high frequency, one of said partial beams and both of said partial beams whereby the signal from said detector when only one partial beam is incident thereon will contain the measurement signal plus a noise signal and when both of said partial beams are incident thereon will contain only the noise signal; and
- (b) forming the quotient of the signal from said detector when only one partial beam is present and the signal from said detector when both partial beams are present on the detector to eliminate the noise component from the measurement signal.

* * * * *